(12) United States Patent
Olgaard et al.

(10) Patent No.: US 8,885,483 B2
(45) Date of Patent: Nov. 11, 2014

(54) SYSTEM AND METHOD FOR TESTING A DATA PACKET SIGNAL TRANSCEIVER

(71) Applicant: Litepoint Corporation, Sunnyvale, CA (US)

(72) Inventors: Christian Volf Olgaard, Saratoga, CA (US); Ruizu Wang, San Ramon, CA (US)

(73) Assignee: Litepoint Corporation, Sunnyvale, CA (US)

( * ) Notice: Subject to any disclaimer, the term of this patent is extended or adjusted under 35 U.S.C. 154(b) by 123 days.

(21) Appl. No.: 13/840,276

(22) Filed: Mar. 15, 2013

(65) Prior Publication Data

US 2014/0269365 A1 Sep. 18, 2014

(51) Int. Cl.
*G01R 31/08* (2006.01)
*H04L 12/26* (2006.01)

(52) U.S. Cl.
CPC .................................... *H04L 43/04* (2013.01)
USPC ........................................ 370/241; 370/252

(58) Field of Classification Search
None
See application file for complete search history.

(56) References Cited

U.S. PATENT DOCUMENTS

| 2004/0187049 | A1 | 9/2004 | West |
| 2007/0243825 | A1 | 10/2007 | Olgaard et al. |
| 2009/0005103 | A1 | 1/2009 | Eisenstadt et al. |
| 2009/0309556 | A1 | 12/2009 | Franco et al. |
| 2010/0008237 | A1 | 1/2010 | Olgaard et al. |
| 2013/0028100 | A1 | 1/2013 | Olgaard |

FOREIGN PATENT DOCUMENTS

| EP | 1583265 A1 | 5/2005 |
| JP | 2006-246191 A | 9/2006 |
| JP | 2010-524341 A | 1/2010 |
| KR | 10-2008-0309556 A | 3/2013 |

OTHER PUBLICATIONS

U.S. Appl. No. 13/841,019, filed March 15, 2013, "System and Method for Testing a Data Packet Signal Transceiver".
U.S. Appl. No. 13/894,817, filed May 15, 2013, "System and Method for Testing a Radio Frequency Multiple-Input Multiple-Output Data Packet Transceiver While Forcing Fewer Data Streams"; 20 Pages.
International Search Report and Written Opinion dated Jun. 16. 2014 issued in connection with PCT/US2014/018252, 10 pgs.
International Search Report and Written Opinion dated Jun. 23, 2014 issued in connection with PCT/US2014/018326, 11 pgs.

*Primary Examiner* — Kibrom T Hailu
(74) *Attorney, Agent, or Firm* — Vedder Price P.C.

(57) ABSTRACT

A system and method for testing signal reception by a data packet signal transceiver. By monitoring signals provided to and returning from a device under test (DUT), e.g., stimulus and response signals, respectively, it can be determined whether and when the DUT has received a faulty data packet or received a valid data packet in a faulty manner. When such events occur, appropriate control signals are provided for instructing the test signal reception and analysis subsystem (e.g., a vector signal analyzer) to capture and retain for analysis such faulty data packet or valid data packet received in a faulty manner. This enables the data packet reception test results to identify the number of data packets correctly received within the prescribed time interval and identify which data packet reception faults are due to reception of a faulty data packet or reception of a valid data packet in a faulty manner.

20 Claims, 12 Drawing Sheets

SYSTEM AND METHOD FOR TESTING A DATA PACKET SIGNAL TRANSCEIVER

BACKGROUND

The present invention relates to testing wireless transceivers, and in particular, to testing wireless data packet signal transceivers.

Many of today's electronic devices use wireless technologies for both connectivity and communications purposes. Because wireless devices transmit and receive electromagnetic energy, and because two or more wireless devices have the potential of interfering with the operations of one another by virtue of their signal frequencies and power spectral densities, these devices and their wireless technologies must adhere to various wireless technology standard specifications.

When designing such devices, engineers take extraordinary care to ensure that such devices will meet or exceed each of their included wireless technology prescribed standard-based specifications. Furthermore, when these devices are later being manufactured in quantity, they are tested to ensure that manufacturing defects will not cause improper operation, including their adherence to the included wireless technology standard-based specifications.

For testing these devices following their manufacture and assembly, current wireless device test systems employ a subsystem for analyzing signals received from each device. Such subsystems typically include at least a vector signal analyzer (VSA) for analyzing signals produced by the device. The analyses performed by the VSA are generally programmable so as to allow each to be used for testing a variety of devices for adherence to a variety of wireless technology standards with differing frequency ranges, bandwidths and signal modulation characteristics.

As part of the manufacturing of wireless communication devices, one significant component of product cost is manufacturing test cost. Typically, there is a direct correlation between the cost of test and the time required to perform such test. Thus, innovations that can shorten test time without compromising test accuracy or increasing capital equipment costs (e.g., increasing costs due to increasing sophistication of test equipment, or testers) are important and can provide significant cost savings, particularly in view of the large numbers of such devices being manufactured and tested.

Among others, one test often conducted involves testing the signal link between a device under test (DUT) and a tester when connected through a conductive signal path (typically in the form of a radio frequency (RF) transmission line (e.g., coaxial cable) having the characteristic impedance of the system) to a reference signal source to allow conveyance and communication of data packets between the reference device and the DUT. Such signal link tests are based on the number of data packets conveyed that are received by the DUT without error during a known or prescribed time interval.

Ordinarily, this type of test includes conveyance of data packets from the reference device to the DUT, which, in turn, responding with responsive data packets indicating whether a correct data packet has been received. The responsive data packets are typically in the form of a confirmation data packet, such as an acknowledgement (ACK) data packet.

However, absent additional circuitry or subsystems for capturing and retaining the data packets sent between the two devices (e.g., the reference data packets from the referenced device and the confirmation data packets from the DUT), it cannot be determined whether faulty packets were received due to faulty packets having been transmitted originally from the reference device, or correct packets had been received but received in a faulty manner by the DUT.

Accordingly, it would desirable to have a technique for capturing packets conveyed between the devices and for retaining those packets in response to which no confirmation packet is returned, or for which a confirmation packet is returned but after a prescribed time limit has been exceeded.

SUMMARY

In accordance with the presently claimed invention, a system and method are provided for testing data packet reception of a data packet signal transceiver. By monitoring data packet signals provided to and returning from a data packet signal transceiver device under test (DUT), e.g., stimulus and response signals, respectively, it can be determined whether and when the DUT has received a faulty data packet or received a valid data packet in a faulty manner. When either of such events has occurred, appropriate control signals are provided for use in instructing the test signal reception and analysis subsystem (e.g., a vector signal analyzer) to capture and retain for analysis such faulty data packet or valid data packet received in a faulty manner. This enables the data packet reception test results to not only identify the number of data packets correctly received within the prescribed time interval but also to identify which data packet reception faults are due to reception of a faulty data packet or reception of a valid data packet in a faulty manner.

In accordance with an exemplary embodiment of the presently claimed invention, a test system for testing data packet reception of a data packet signal transceiver includes: a signal path with first and second signal path connections for conveying first and second data packet signals, including at least first and second data packet signal portions, respectively, wherein the first data packet signal is from a reference data packet signal transceiver for conveyance from the first signal path connection to the second signal path connection, and the second data packet signal is from a data packet signal transceiver device under test (DUT) for conveyance from the second signal path connection to the first signal path connection; data packet signal detection circuitry coupled to the second signal path connection and responsive to the first and second data packet signals by providing at least one or more DUT packet measurement signals indicative of at least one of a magnitude, start time and end time of each of the first and second data packet signal portions at the second signal path connection; and control circuitry coupled to the data packet signal detection circuitry and responsive to the one or more DUT packet measurement signals and to one or more reference packet measurement signals indicative of at least one of a magnitude, start time and end time of at least the first data packet signal portion at the first signal path connection by providing one or more control signals corresponding to at least the first data packet signal portion at the second signal path connection.

In accordance with another exemplary embodiment of the presently claimed invention, a method of testing data packet reception of a data packet signal transceiver includes: providing a signal path with first and second signal path connections for conveying first and second data packet signals, including at least first and second data packet signal portions, respectively; conveying, from a reference data packet signal transceiver, the first data packet signal from the first signal path connection to the second signal path connection; conveying, from a data packet signal transceiver device under test (DUT), the second data packet signal from the second signal path connection to the first signal path connection; responding to the first and second data packet signals by providing at least one or more DUT packet measurement signals indicative of at least one of a magnitude, start time and end time of each of the first and second data packet signal portions at the second signal path connection; and responding to the one or more DUT packet measurement signals and to one or more reference packet measurement signals by providing one or more control signals, wherein the one or more reference packet measurement signals are indicative of at least one of a magnitude, start time and end time of at least the first data packet signal portion at the first signal path connection, and the one or more control signals correspond to at least the first data packet signal portion at the second signal path connection.

In accordance with another exemplary embodiment of the presently claimed invention, a method of testing data packet reception of a data packet signal transceiver includes: providing a signal path with first and second signal path connections for conveying first and second data packet signals, including at least first and second data packet signal portions, respectively, wherein the first data packet signal is from a reference data packet signal transceiver for conveyance from the first signal path connection to the second signal path connection, and the second data packet signal is from a data packet signal transceiver device under test (DUT) for conveyance from the second signal path connection to the first signal path connection; providing data packet signal detection circuitry coupled to the second signal path connection and responsive to the first and second data packet signals by providing at least one or more DUT packet measurement signals indicative of at least one of a magnitude, start time and end time of each of the first and second data packet signal portions at the second signal path connection; and providing control circuitry coupled to the data packet signal detection circuitry and responsive to the one or more DUT packet measurement signals and to one or more reference packet measurement signals indicative of at least one of a magnitude, start time and end time of at least the first data packet signal portion at the first signal path connection by providing one or more control signals corresponding to at least the first data packet signal portion at the second signal path connection.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

As discussed in more detail below, systems and methods for testing data packet reception in accordance with the presently claimed invention facilitate the controlling of capture and conditional retention of conveyed data packets to ensure that correctly received data packets can be captured but disregarded and not retained (e.g., not stored) while faulty and possibly faulty data packets are captured and retained for analysis. System test time is reduced since the capture and retention of faulty or possibly faulty data packets can be controlled and achieved simultaneously with the conveyance of data packets during normal testing. Further, system costs can be reduced by reducing the amount of data storage otherwise required if all data packets, including known good data packets and not just faulty or possibly data packets, were captured and retained for analysis.

Figure 1:
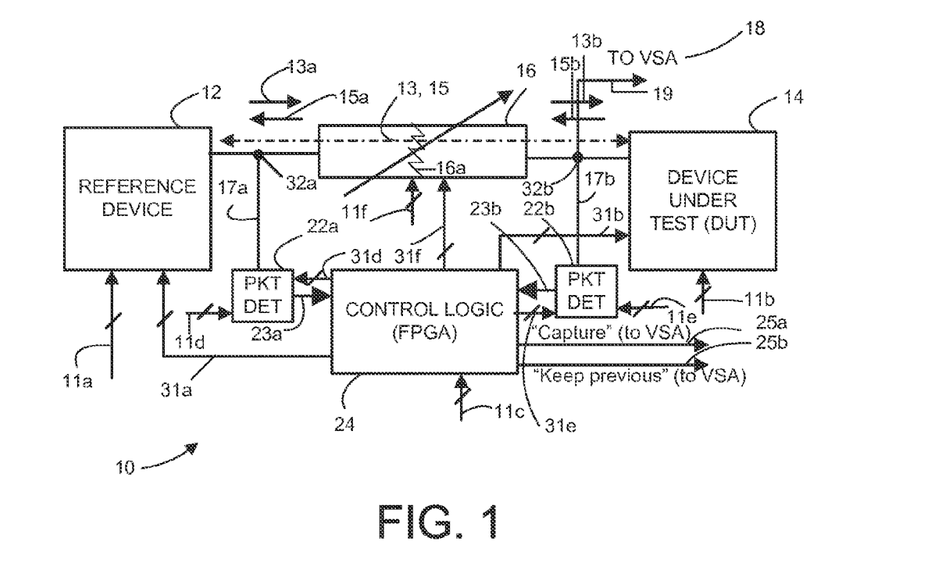
FIG. 1 depicts a testing environment for testing data packet reception in accordance with exemplary embodiments of the presently claimed invention.

Referring to FIG. 1, a testing environment 10 in accordance with exemplary embodiments of the presently claimed invention include a reference device 12, a DUT 14, a cabled signal connection 16, one or more packet detection circuits 22a, 22b, control logic 24 (e.g., a field programmable gate array), and one or more signal dividing or coupling circuits (e.g., resistive signal dividers or couplers) 32a, 32b (discussed in more detail below). The reference device 12 can be implemented using a known good device, such as a DUT which has already been tested and is known to operate in accordance with all prescribed operating standards and characteristics (or at least those prescribed operating characteristics necessary for current testing purposes). The cabled signal connection 16 preferably, though not necessarily, includes a signal attenuator 16a, which can be variable in accordance with a control signal. In accordance with well-known testing techniques and operations, the reference device 12, DUT 14, control logic 24, packet detectors 22a, 22b and signal attenuator 16a can be controlled by respective externally sourced control signals, as well as communicate to external subsystems via other control or data signals (not shown). For example, the reference device 12, DUT 14, control logic 24, packet detectors 22a, 22b and signal attenuator 16a can each be controlled by one or more respective externally sourced control signals 11a, 11b, 11 c, 11d, 11e, 11f (e.g., from a personal computer controlling the test operations). Alternatively, or additionally, the reference device 12, DUT 14, packet detectors 22a, 22b and signal attenuator 16a can each be controlled by one or more respective control signals 31a, 31b, 31d, 31e, 31f provided by the control logic (e.g., under the direction of its externally sourced control signal(s) 11c).

The reference device 12 provides a data packet signal 13 for the DUT 14, which, in turn, responds with its own data packet signal 15. Such responsive data packet signal 15 is typically in the form of confirmation signals (e.g., ACK signals) indicating, or confirming, proper reception of valid data packets within the reference data packet signal 13.

The signal path 16, e.g., a RF transmission line, is in electrical communication with the reference device 12 and DUT 14 via first 32a and second 32b signal connections which include the signal splitting or coupling circuitry. As discussed in more detail below, such circuitry provides a divided or coupled portion of the transmitted reference data packet signal 13a (and, if desired, the received responsive data packet signal 15a) as the input signal 17a to the first packet detector 22a. Similarly, such circuitry provides a divided or coupled portion of the received referenced data packet signal 13b (and, if desired, the transmitted responsive data packet signal 15b) as the input signal 17b to the second packet detector 22b. This circuitry also provides divided or coupled portions of these signals 13b, 15b as an input signal 19 for signal receiver and analysis circuitry 18, e.g., a VSA.

As discussed in more detail below, the packet detectors 22a, 22b provide packet detection signals 23a, 23b to the control logic 24. These packet detection signals 23a, 23b preferably provide information indicative of magnitude, e.g., power level, and start and end times of the reference 13 and responsive 15 data packet signals. For example, the first packet detector 22a can provide data packet magnitude and data packet start and end time information for the transmitted reference data packet signal 13a and received responsive data signal 15a. Similarly, the second packet detector 22b can provide data packet magnitude and start and end time information for the received reference data packet signal 13b and transmitted responsive data packet signal 15b. Also, the data packet magnitude information provided by the packet detectors 22a, 22b allows the type of signal being detected to be identified. For example, if the first packet detection signal 23a indicates a higher signal magnitude than that indicated by the second packet detection signal 23b, that means that the transmitted 13a and received 13b reference data packet signals are being detected. Similarly, if the first packet detection signal 23a indicates a lower signal magnitude than that indicated by the second packet detection signal 23b, that means that the transmitted 15b and received 15a responsive data packet signals are being detected.

Alternatively, a single packet detector can be used, e.g., either the first 22a or second 22b packet detector. By monitoring the detected signal magnitudes at either the first 32a or second 32b signal connection and comparing them to a predetermined threshold magnitude value, it can be determined whether the reference device signal 13 or DUT signal 15 is being detected. For example, due to the signal attenuator 16a, detected signal magnitudes at the first signal connection 32a higher and lower than the threshold magnitude value correspond to the reference 13 and DUT 15 signals, respectively, and detected signal magnitudes at the second signal connection 32ba higher and lower than the threshold magnitude value correspond to the DUT 15 and reference 13 signals, respectively.

The packet detection signals 23a, 23b are processed by the control logic 24 to provide one or more commands, or control signals 25a, 25b, for the signal receiver and analysis circuitry 18. These commands can include "capture" 25a and "keep previous" 25b commands to inform the signal receiving and analysis system 18 that data packets currently being received should be captured (per the "capture" command 25a) and that previously received and captured data packets should be retained for analysis (per the "keep previous" command 25b).

Figure 2:
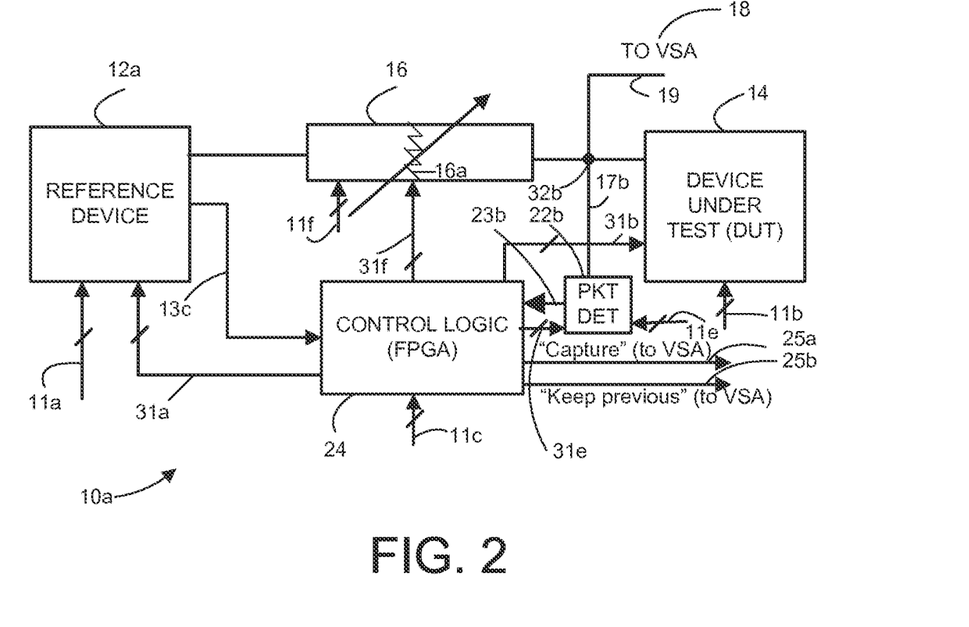
FIG. 2 depicts a testing environment for testing data packet reception in accordance with alternative exemplary embodiments of the presently claimed invention.

Referring to FIG. 2, in accordance with alternative exemplary embodiments, the testing environment 10a can omit the first reference packet detector 22a (FIG. 1). In such embodiment 10a, the reference device 12a provides data packet information 13c (e.g., data packet magnitude and start and end time information for the transmitted reference data packet signal 13a) used by the control logic 24 to provide the "capture" 25a and "keep previous" 25b commands as discussed above. This also avoids a need for the first reference signal dividing or coupling circuitry 32a between the reference device 12a and signal path 16.

Figure 3:
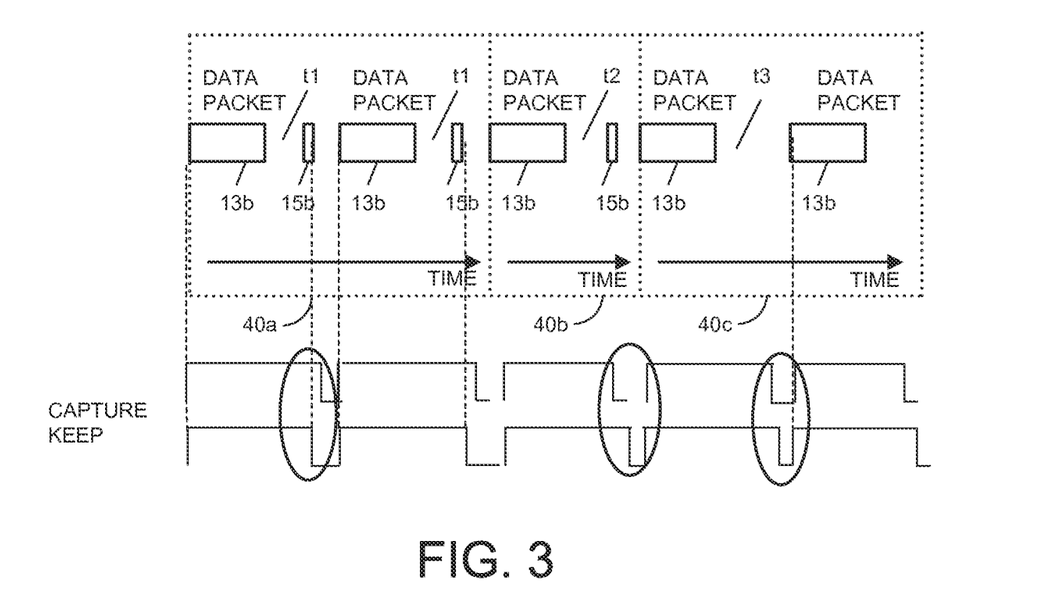
FIG. 3 is a signal diagram depicting conveyance of tested data packets and confirmation data packets as a result of successful reception of valid data packets by the DUT, and conveyance of tested data packets and late or no confirmation data packets due to reception of faulty data packets or reception in a faulty manner.

Referring to FIG. 3, reference 13 and responsive 15 signals are depicted for different testing scenarios. In the first scenario 40a, the DUT 14 (FIGS. 1 and 2) receives the reference data packets 13b. In this scenario 40a, these data packets 13b are good, or valid, and are properly received and captured by the DUT 14. Accordingly, within the prescribed time interval t1, the DUT 14 responds by transmitting confirmation data packets 15b. Accordingly, the control logic 24 would provide appropriate "capture" 25a and "keep previous" 25b commands to inform the receiving and analysis circuitry 18 that valid data packets 13b were properly received and captured and need not be retained for analysis.

In the second scenario 40b, the reference data packets 13b are received by the DUT 14. However, the responsive confirmation data packet 15b provided by the DUT 14 is transmitted after a time interval t2 that exceeds the prescribed time interval between the end of the reference packet 13b and expected start of the responsive packet 15b. Accordingly, the control logic 24 will interpret this as a situation where the reference data packet 13b is faulty or may be valid but was received or captured in a faulty manner and should be retained for analysis. Accordingly, the control logic 24 provides appropriate "capture" 25a and "keep previous" 25b commands for the signal receiving and analysis circuitry 18.

In the third scenario 40c, the reference data packet 13b is received by the DUT 14 but no confirmation data packet is provided in response. Following a timeout interval t3, another reference data packet 13b is received and, again, no responsive confirmation data packet 15 is returned. Accordingly, the control logic 24 interprets this situation as faulty or possibly faulty data packets having been received by the DUT 14, and, therefore, provides appropriate "capture" 25a and "keep previous" 25b commands to the signal receiving and analysis circuitry 18 for retention of these data packets 13b for analysis.

For example, the "capture" 25a and "keep previous" 25b commands are asserted (e.g., "high") during the reference packet 13b and remain asserted (meaning capture this packet 13b) until it is determined whether the reference packet 13b has been successfully received, as indicated by the timely transmission of the responsive packet 15b. Hence, in the first scenario 40a, the reference packet 13b has been successfully received, so the "keep previous" command 25b is de-asserted following the timely transmission of the responsive packet 15b, and the "capture" command 25a is then also de-asserted, thereby indicating that the reference packet 13b need not be kept for analysis. However, in the second 40b and third 40c scenarios, the reference packet 13b has not been successfully received, as indicated by the late transmission or no transmission, respectively, of the responsive packet 15b. Accordingly, the "keep previous" command 25b remains asserted until after the "capture" command 25a is de-asserted, thereby indicating that the reference packet 13b should be kept for analysis.

As will be readily appreciated by one skilled in the art, data packets transmitted as part of the DUT data packet signal 15 can be captured and retained for analysis as well. In other words, similar to the receive (RX) testing as discussed above for data packets 15b intended for reception by the DUT 14, a similar procedure can be followed for transmit (TX) testing of the DUT 14. For example, during transmission of data packet signals 15 by the DUT 14, the "capture" 25a and "keep previous" 25b commands can be used to instruct the signal receiving and analysis circuitry 18 to capture retain for analysis those DUT data packets 15b for which their corresponding data packets 15a available for reception by the reference device 12 have been determined to be faulty or have otherwise not been successfully received by the reference device 12. Such use of the "capture" 25a and "keep previous" 25b commands in this manner can be initiated or controlled in accordance with feedback data provided by the reference device 12 to the control logic 24 (e.g., via their mutual signal interface 31a).

Figure 4:
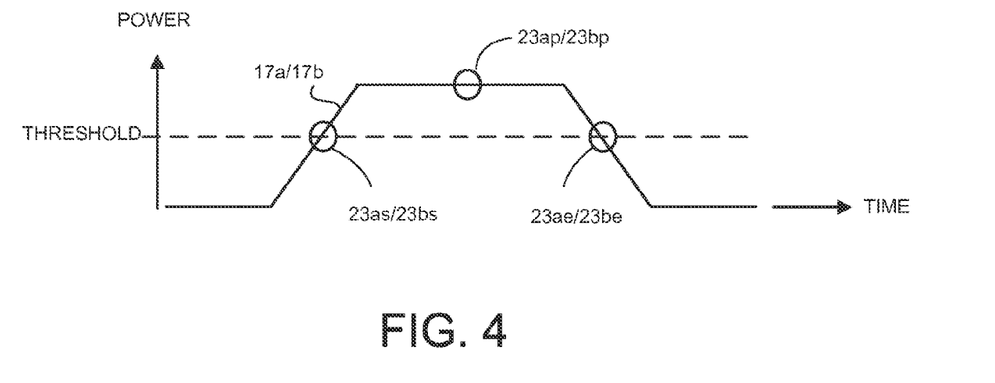
FIG. 4 depicts a signal timing diagram identifying signal parameters captured by the packet detection circuitry of FIGS. 1 and 2.

Referring to FIG. 4, as discussed above, the packet detectors 22a, 22b (FIGS. 1 and 2) provide packet detection signals 23a, 23b containing information about the magnitude 23ap/23bp, start times 23as/23bs and end times 23ae/23be of the divided or coupled reference 13a/13b and responsive 15a/15b data packets. Such signal measurements can be done using voltage or power detection circuits, which are well known in the art. The data packet magnitude 23ap/23bp can be measured at a desired point in time during the time interval in which the peak signal level is expected, while the start 23as/23bs and end 23ae/23be times of the data packet signal can be measured as the divided or coupled signal 17a/17b transcends one or more predetermined signal thresholds defined between the expected minimum and maximum data packet signal levels.

Figure 5:
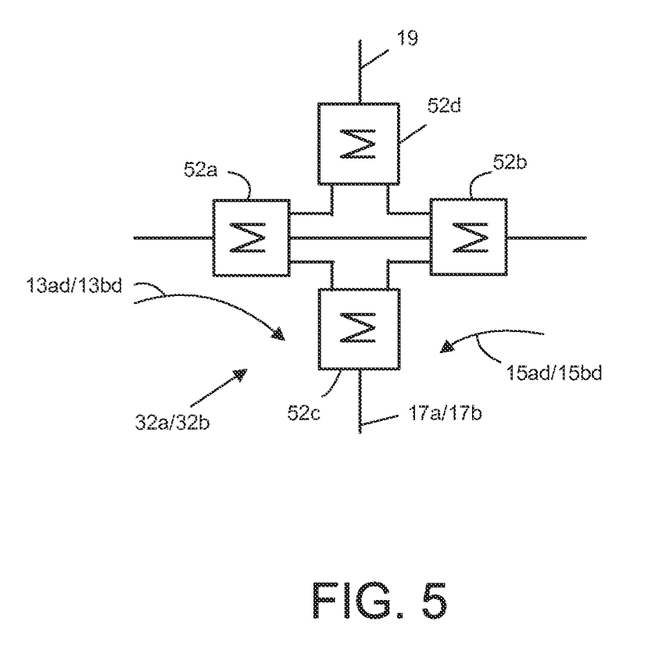
FIGS. 5 and 6 depict exemplary embodiments of the signal dividing or coupling circuitry of FIGS. 1 and 2.

Referring to FIG. 5, the signal dividing or coupling circuitry 32a/32b (FIGS. 1 and 2) can be implemented using signal dividers/adders 52a, 52b, 52c, 52d, interconnected substantially as shown. In accordance with well-known principles, power-divided portions of the referenced data packets 13ad/13bd and responsive data packets 15ad/15bd provided by the two in-line dividers/adders 52a, 52b become the power-divided data packet signals 17a/17b provided to the packet detectors 22a/22b. In the case of the second signal divider or coupler 32b, an additional shunt divider/adder 52d conveys power-divided portions of the reference 13ad/13bd and responsive 15ad/15bd data packets to the signal receiving and analysis circuitry 18. (As noted above, these can be implemented as simple resistive signal dividers, which are well known in the art.)

Figure 6:
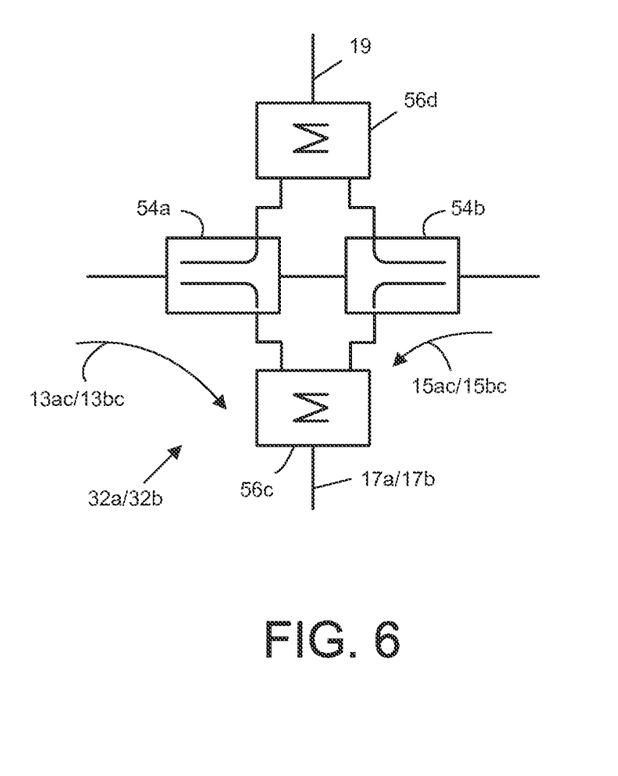

Referring to FIG. 6, in accordance with another exemplary embodiment, in-line signal couplers 54a/54b can be used instead of divider/adder circuits 52a, 52b (FIG. 5). In this embodiment, coupled portions of the reference 13ac/13bc and responsive 15ac/15bc data packets are provided via signal combiners 56c, 56d as the input signals 17a/17b to the packet detectors 22a, 22b and the input signal 19 to the signal receiving and analysis circuitry 18.

Figure 7:
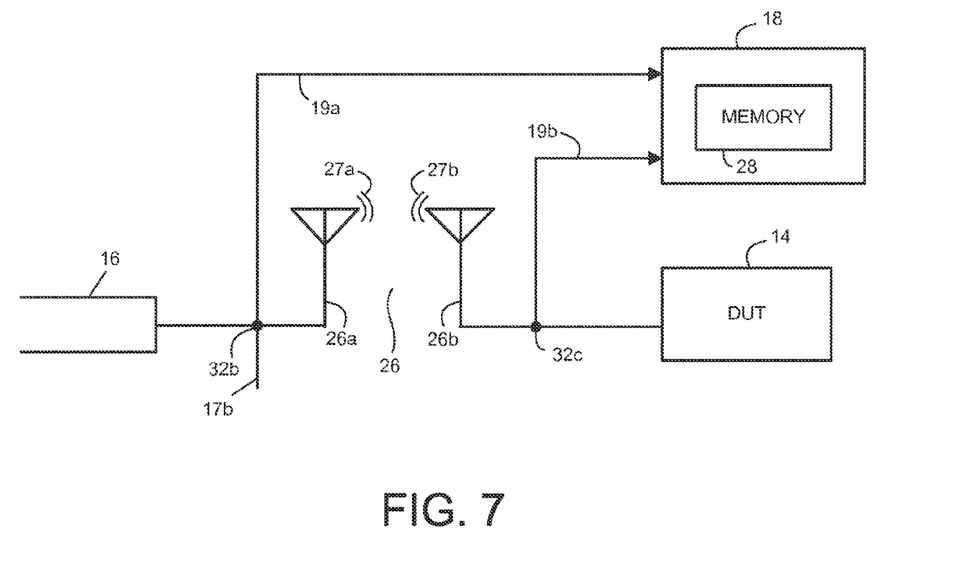
FIG. 7 depicts exemplary alternative embodiments of a portion of the testing environments of FIGS. 1 and 2.

Referring to FIG. 7, in accordance with exemplary alternative embodiments, the second connection, between the cabled signal path 16 and DUT 14, can include a wireless connection 26 via which the reference 13 and responsive 15 signals can be conveyed via radiated electromagnetic waves 27a, 27b between antennas 26a, 26b connected to the cabled signal path 16 and DUT 14. In such an embodiment, the signal path 19 to the signal receiver and analysis circuitry 18 can be implemented as a signal path 19a connected at the cabled signal path 16 side and an additional signal path 19b connected at the DUT 14 side of the wireless signal connection 26. This would ensure reliable reception and capturing of data and confirmation packets originating from the reference device 12 and DUT 14 for analysis, as discussed above. In accordance with well-known techniques, the captured packets can be stored in memory 28 contained within, connected to, or otherwise associated with the signal receiver and analysis circuitry 18.

Figure 8:
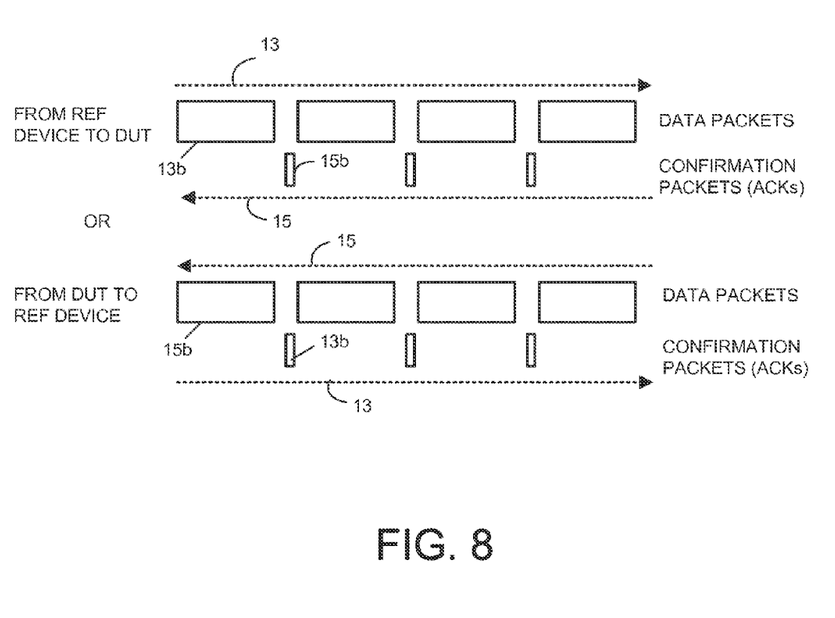
FIG. 8 is a signal diagram depicting exemplary conveyance of data packets and confirmation packets between the reference device and DUT in the testing environments of FIGS. 1 and 2.

Referring to FIG. 8, in accordance with additional exemplary embodiments and as discussed in more detail below, the reference signal 13 and responsive signal 15 can include reference data packets 13b and confirmation packets 15b, respectively. Alternatively, the DUT 14 can transmit a signal 15 containing data packets 15b to which the reference device 12 responds by transmitting a responsive signal 13 containing responsive, e.g., confirmation, packets 13b, in accordance with well-known techniques.

Figure 9:
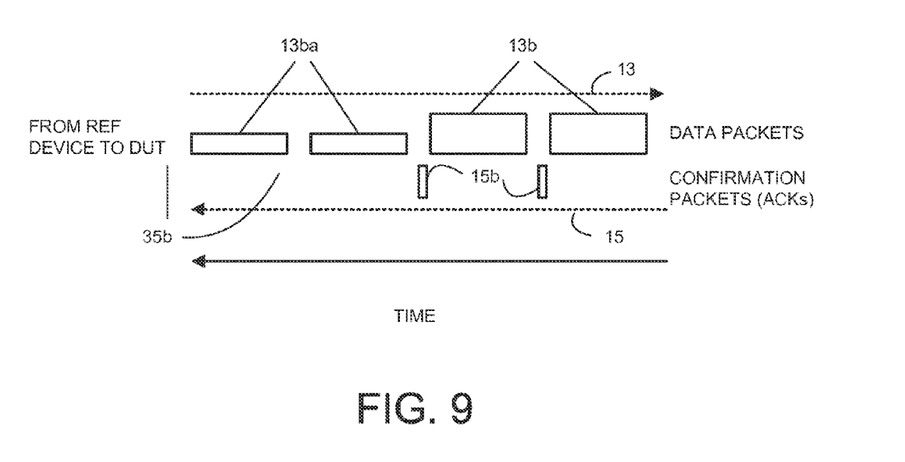
FIG. 9 is a signal diagram depicting exemplary conveyance of data packets and confirmation packets before and after imposing signal attenuation upon the reference data packet signal.

Referring to FIG. 9, as discussed above, testing of the DUT 14 includes providing it with test data packet signals 13b via the signal path 16 with controllable (e.g., incrementally increased and decreased) signal attenuation 16a. For example, as depicted here, the first two test data packets 13b are presented at a nominal signal power, following which, successive data packets 13ba are attenuated. For purposes of this example, the attenuation is sufficient to result in unsuccessful reception of the data packets 13ba by the DUT 14. Accordingly, the DUT responds with confirmation packets 15b following successful reception of the earlier data packets 13b, but, due to its unsuccessful reception of the attenuated data packets 13ba, no responsive confirmation packets are returned during the time intervals 35b in which they would be expected by the reference device 12.

As will be readily appreciated by one skilled in the art, the level of signal attenuation 16a (as well as data related to the corresponding power level of the test data packet signal 13) can be noted and stored, e.g., within the control logic 24, at the onset of the failures to receive responsive confirmation packets 15b. For example, following transmission of the first attenuated data packet 13ba and the first responsive time interval 35b during which no responsive confirmation packet 15b is received, the signal attenuation and/or signal 13 power level can be recorded as the reference device 12 begins retransmission of the test data packets 13ba for which no confirmation packets 15b were received.

Figure 10:
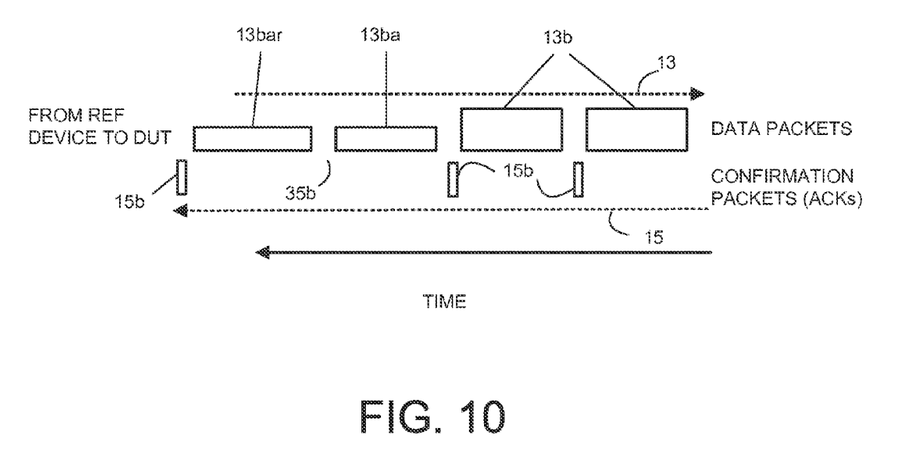
FIG. 10 is a signal diagram depicting exemplary conveyance of data packets and confirmation packets before and after imposing signal attenuation upon the reference data packet signal and a decrease in the data rate of the reference data packet signal.

Referring to FIG. 10, alternatively, following transmission of the first attenuated data packet 13ba resulting in no reception of a confirmation packet during the responsive time interval 35b, the reference device 12 can initiate a reduction in the data rate of the transmitted data packets 13b (e.g., in accordance with the operating protocol of the reference device 12 and DUT 14). If the amount of data being transmitted remains unchanged, this results in a data packet 13bar having a longer packet duration. This longer packet duration can be detected by the control logic 24 (based on the start and end times of the data packet 13bar as measured by one or more of the packet detectors 22a, 22b, as discussed above), and would be recognized as corresponding to a reduction in the data rate within such data packet 13bar. In some instances, this can result in successful reception of the data packet 13bar and the transmission of a responsive confirmation packet 15b accordingly. Such combination of a failure to receive a confirmation packet and a subsequent reception of a confirmation packet 15b in response to a subsequent data packet 13bar having a reduced data rate could be interpreted as indicative of the onset of the sensitivity limit (e.g., the "knee point") of the DUT 14.

Figure 11:
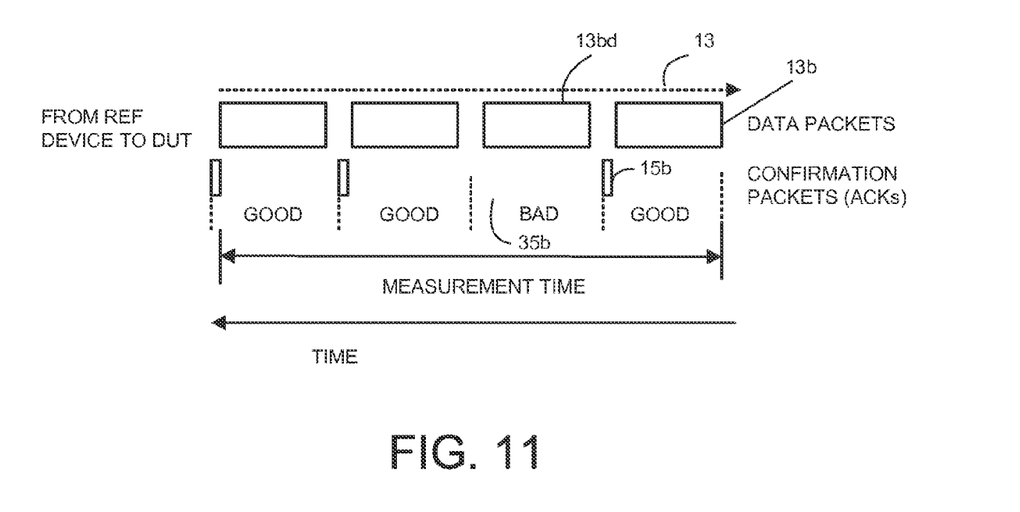
FIG. 11 is a signal diagram depicting exemplary conveyance of data packets and confirmation packets for testing data packet throughput in the testing environments of FIGS. 1 and 2.

Referring to FIG. 11, in accordance with another exemplary embodiment, data throughput of the DUT 14 can be tested with little or no interaction with the DUT other than exchanges of data packets and responsive confirmation packets. For purposes of this example, four data packets 13b are sent by the reference device 12 to the DUT 14. However, only three of the data packets 13b evoke responsive confirmation packets 15b. In this example, the second transmitted test data packet 13bd was somehow deemed a defective data packet or otherwise unsuccessfully received by the DUT 14. Accordingly, during the response time interval 35b, no confirmation packet 15b is returned. As a result, within the time interval as shown, the number of data bits successfully transferred from the reference device 12 to the DUT 14 would be equal to those contained within the three successfully received data packets 13b corresponding to the three responsive confirmation packets 15b. By knowing the number of bits within each data packet 13b, a number of detected packets sent within the known time interval, and the number of detected confirmation packets 15b corresponding to those successfully transmitted data packets 13b, the data throughput in bits per second can be determined, e.g., computed by the control logic 24.

Alternatively, one could also measure the time it takes to transmit a predetermined number (n) of good data packets and from that derive the same throughput metric. Defective or otherwise unsuccessfully received data packets 13bd would produce no confirmation packet 15b during the response time interval 35b. Accordingly, the bits contained in such defective, or otherwise unsuccessfully received, packets would not be considered as successfully transferred and would not contribute to the total number of transferred bits. They would simply cause the data transfer time interval to be longer, and thereby reduce the measured throughput.

Figure 12:
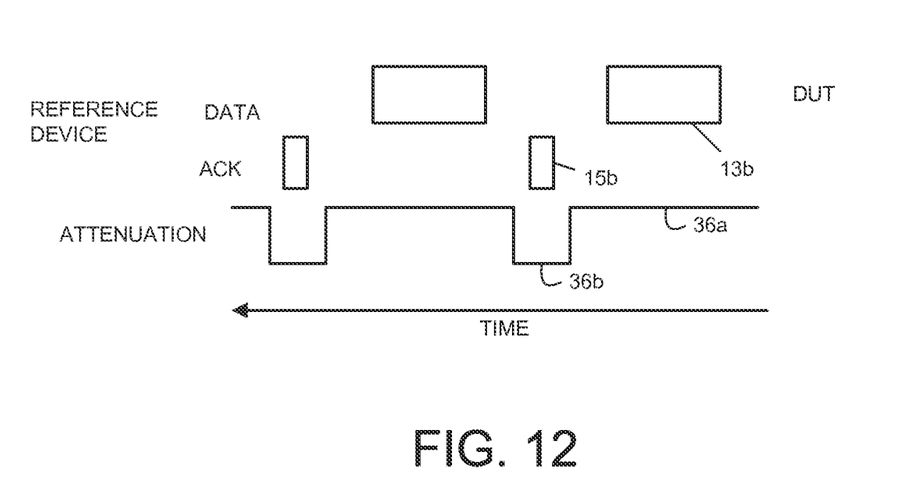
FIG. 12 is a signal diagram depicting an exemplary timing relationship for the data packets, confirmation packets and signal attenuation imposed during operation of the testing environments of FIGS. 1 and 2.

Referring to FIG. 12, to ensure maximum likelihood of receiving the response signal 15 transmitted by the DUT 14 following increases in attenuation 16a of the signal path 16 for the incident test signal 13, such attenuation 16a can be decreased during the time intervals in which responsive confirmation packets 15b are expected. For example, as discussed above, the RF test signal 13 attenuation 16a is increased during transmission of the test data packets 13b. However, as noted, to help ensure that responsive confirmation packets 15b evoked from the DUT 14 are successfully received by the reference device 12, the attenuation 16a can be decreased. Accordingly, the time intervals during which the test signal attenuation is higher and lower are non-coincident. For example, the test signal attenuation is higher 36a during a time interval at least coextensive with the duration of the test data packets 13b, while the time interval 36b during which the signal path attenuation 16a is lower is at least coextensive with the time interval during which a response data packet 15b is expected.

Various other modifications and alterations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a test system for testing data packet reception of a data packet signal transceiver, comprising:
   a signal path with first and second signal path connections for conveying first and second data packet signals, including at least first and second data packet signal portions, respectively, wherein said first data packet signal is from a reference data packet signal transceiver for conveyance from said first signal path connection to said second signal path connection, and said second data packet signal is from a data packet signal transceiver device under test (DUT) for conveyance from said second signal path connection to said first signal path connection;
   data packet signal detection circuitry coupled to said second signal path connection and responsive to said first and second data packet signals by providing at least one or more DUT packet measurement signals indicative of at least one of a magnitude, start time and end time of each of said first and second data packet signal portions at said second signal path connection; and
   control circuitry coupled to said data packet signal detection circuitry and responsive to said one or more DUT packet measurement signals and to one or more reference packet measurement signals indicative of at least one of a magnitude, start time and end time of at least said first data packet signal portion at said first signal path connection by providing one or more control signals corresponding to at least one of said first and second data packet signal portions at said second signal path connection.

2. The apparatus of claim 1, wherein said signal path comprises a radio frequency (RF) signal path.

3. The apparatus of claim 1, wherein said signal path comprises a signal attenuator between said first and second signal path connections.

4. The apparatus of claim 1, wherein said data packet signal detection circuitry comprises power detection circuitry.

5. The apparatus of claim 1, wherein said data packet signal detection circuitry is further coupled to said first signal path connection and responsive to at least one of said first and second data packet signals by providing said at least one or more reference packet measurement signals.

6. The apparatus of claim 5, wherein said data packet signal detection circuitry comprises:
   first power detection circuitry coupled to said first signal path connection; and
   second power detection circuitry coupled to said second signal path connection.

7. The apparatus of claim 1, wherein said control circuitry comprises logic circuitry.

8. The apparatus of claim 1, further comprising a vector signal analyzer coupled to said second signal path connection and said control circuitry, and responsive to said one or more control signals by capturing at least part of at least one of said first and second data packet signal portions.

9. A method of testing data packet reception of a data packet signal transceiver, comprising:
   providing a signal path with first and second signal path connections for conveying first and second data packet signals, including at least first and second data packet signal portions, respectively;
   conveying, from a reference data packet signal transceiver, said first data packet signal from said first signal path connection to said second signal path connection;
   conveying, from a data packet signal transceiver device under test (DUT), said second data packet signal from said second signal path connection to said first signal path connection;
   responding to said first and second data packet signals by providing at least one or more DUT packet measurement signals indicative of at least one of a magnitude, start time and end time of each of said first and second data packet signal portions at said second signal path connection; and
   responding to said one or more DUT packet measurement signals and to one or more reference packet measurement signals by providing one or more control signals, wherein said one or more reference packet measurement signals are indicative of at least one of a magnitude, start time and end time of at least said first data packet signal portion at said first signal path connection, and said one or more control signals correspond to at least one of said first and second data packet signal portions at said second signal path connection.

10. The method of claim 9, wherein said providing a signal path comprises providing a radio frequency (RF) signal path.

11. The method of claim 9, wherein said providing a signal path comprises providing a signal attenuator between said first and second signal path connections.

12. The method of claim 9, wherein said responding to said first and second data packet signals comprises measuring each of said first and second data packet signal portions at said second signal path connection.

13. The method of claim 12, wherein said measuring each of said first and second data packet signal portions at said second signal path connection comprises detecting a power of each of said first and second data packet signal portions.

14. The method of claim 9, further comprising responding to at least one of said first and second data packet signals by providing said at least one or more reference packet measurement signals.

15. The method of claim 14, wherein:
   said responding to said first and second data packet signals comprises measuring each of said first and second data packet signal portions at said second signal path connection; and
   said responding to at least said first data packet signal comprises measuring said first data packet signal portion at said first signal path connection.

16. The method of claim 15, wherein:
   said measuring each of said first and second data packet signal portions at said second signal path connection comprises detecting a power of each of said first and second data packet signal portions; and
   said measuring said first data packet signal portion at said first signal path connection comprises detecting a power of said first data packet signal portion.

17. The method of claim 9, wherein said responding to said one or more DUT packet measurement signals and to one or more reference packet measurement signals by providing one or more control signals comprises processing said one or more DUT packet measurement signals and said one or more reference packet measurement signals with logic circuitry.

18. The method of claim 9, further comprising responding to said one or more control signals by capturing at least part of at least one of said first and second data packet signal portions via said second signal path connection.

19. A method of testing data packet reception of a data packet signal transceiver, comprising:
   providing a signal path with first and second signal path connections for conveying first and second data packet signals, including at least first and second data packet signal portions, respectively, wherein said first data packet signal is from a reference data packet signal transceiver for conveyance from said first signal path connection to said second signal path connection, and said second data packet signal is from a data packet signal transceiver device under test (DUT) for conveyance from said second signal path connection to said first signal path connection;
   providing data packet signal detection circuitry coupled to said second signal path connection and responsive to said first and second data packet signals by providing at least one or more DUT packet measurement signals indicative of at least one of a magnitude, start time and end time of each of said first and second data packet signal portions at said second signal path connection; and
   providing control circuitry coupled to said data packet signal detection circuitry and responsive to said one or more DUT packet measurement signals and to one or more reference packet measurement signals indicative of at least one of a magnitude, start time and end time of at least said first data packet signal portion at said first signal path connection by providing one or more control signals corresponding to at least one of said first and second data packet signal portions at said second signal path connection.

20. The method of claim 19, further comprising providing a vector signal analyzer for coupling to said second signal path connection and said control circuitry, and for responding to said one or more control signals by capturing at least part of at least one of said first and second data packet signal portions.

* * * * *